United States Patent
Fujino et al.

(10) Patent No.: US 10,431,491 B2
(45) Date of Patent: Oct. 1, 2019

(54) SEMICONDUCTOR DEVICE HAVING A TRIPLE INSULATING FILM SURROUNDED VOID

(71) Applicants: Kabushiki Kaisha Toshiba, Minato-ku, Tokyo (JP); Toshiba Electronic Devices & Storage Corporation, Minato-ku, Tokyo (JP)

(72) Inventors: Yuhki Fujino, Kanazawa Ishikawa (JP); Noboru Yokoyama, Kanazawa Ishikawa (JP); Hideki Okumura, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/876,412

(22) Filed: Jan. 22, 2018

(65) Prior Publication Data

US 2018/0342415 A1    Nov. 29, 2018

(30) Foreign Application Priority Data

May 24, 2017  (JP) ................................ 2017-102560

(51) Int. Cl.
  *H01L 29/06*   (2006.01)
  *H01L 29/66*   (2006.01)
  (Continued)

(52) U.S. Cl.
  CPC .... *H01L 21/76224* (2013.01); *H01L 29/0634* (2013.01); *H01L 29/0653* (2013.01);
  (Continued)

(58) Field of Classification Search
  CPC ............. H01L 29/0634; H01L 29/0653; H01L 29/0696; H01L 29/4236; H01L 29/66734;
  (Continued)

(56) References Cited

U.S. PATENT DOCUMENTS 6,200,851 B1 * 3/2001 Arnold ............. H01L 27/10841
                                                    438/243
6,337,499 B1 * 1/2002 Werner ............... H01L 29/0634
                                                    257/329
(Continued)

FOREIGN PATENT DOCUMENTS

JP        3348090 B2    11/2002
JP        3993458 B2    10/2007
JP        4285899 B2    6/2009

OTHER PUBLICATIONS

P. Moens, et al., "UltiMOS: A Local Charge-Balanced Trench-Based 600V Super-Junction Device", Proc. ISPSD, pp. 304-307, May 2011.

(Continued)

*Primary Examiner* — Ida M Soward
(74) *Attorney, Agent, or Firm* — White & Case LLP

(57) ABSTRACT

According to an embodiment, a method of manufacturing a semiconductor device includes forming a semiconductor layer having a first conductivity type on a semiconductor substrate, forming a trench in the semiconductor substrate and the semiconductor layer, forming a semiconductor film having a second conductivity type on an inner wall surface and a bottom surface of the trench, forming a first insulating film including silicon oxide on a side surface and a bottom surface of the semiconductor film, forming a second insulating film including silicon nitride on a side surface and a bottom surface of the first insulating film, and forming a third insulating film including silicon oxide on a side surface and a bottom surface of the second insulating film.

18 Claims, 12 Drawing Sheets

(51) Int. Cl.
*H01L 29/78* (2006.01)
*H01L 29/49* (2006.01)
*H01L 29/51* (2006.01)
*H01L 21/762* (2006.01)
*H01L 29/423* (2006.01)

(52) U.S. Cl.
CPC ...... *H01L 29/0696* (2013.01); *H01L 29/4236* (2013.01); *H01L 29/66734* (2013.01); *H01L 29/7813* (2013.01); *H01L 29/0649* (2013.01); *H01L 29/4991* (2013.01); *H01L 29/515* (2013.01)

(58) Field of Classification Search
CPC ............. H01L 29/7813; H01L 29/0649; H01L 29/4991; H01L 29/515
See application file for complete search history.

(56) References Cited

U.S. PATENT DOCUMENTS

| | | | | |
|---|---|---|---|---|
| 6,518,144 | B2 | 2/2003 | Nitta et al. | |
| 6,727,186 | B1* | 4/2004 | Skotnicki | H01L 21/28167 257/E21.193 |
| 6,740,931 | B2 | 5/2004 | Kouzuki et al. | |
| 7,821,060 | B2* | 10/2010 | Kitamura | H01L 21/28061 257/330 |
| 8,097,501 | B2* | 1/2012 | Sakuma | H01L 29/7802 438/198 |
| 8,198,196 | B1* | 6/2012 | Murphy | H01L 29/7813 438/720 |
| 8,319,278 | B1* | 11/2012 | Zeng | H01L 29/7809 257/330 |
| 8,372,716 | B2* | 2/2013 | Loechelt | H01L 29/0634 438/270 |
| 8,563,987 | B2* | 10/2013 | Sorada | H01L 21/044 257/77 |
| 8,907,408 | B2* | 12/2014 | Sedlmaier | H01L 21/765 257/329 |
| 9,379,043 | B1* | 6/2016 | Wang | H01L 23/481 |
| 9,929,181 | B2* | 3/2018 | Kautzsch | H05K 1/0284 |
| 2006/0091453 | A1* | 5/2006 | Matsuda | H01L 29/7813 257/330 |
| 2008/0203483 | A1* | 8/2008 | Kuroki | H01L 21/76264 257/368 |
| 2009/0079085 | A1* | 3/2009 | Hannuki | H01L 23/3677 257/773 |
| 2012/0156844 | A1* | 6/2012 | Kim | H01L 27/10823 438/270 |
| 2015/0214348 | A1* | 7/2015 | Gamerith | H01L 29/0619 257/139 |
| 2016/0155685 | A1* | 6/2016 | Chen | H01L 23/481 257/762 |
| 2016/0218190 | A1* | 7/2016 | Fukuoka | H01L 29/4236 |
| 2016/0351450 | A1* | 12/2016 | Migita | H01L 21/76898 |
| 2017/0053992 | A1* | 2/2017 | Okada | H01L 29/4236 |
| 2018/0026050 | A1* | 1/2018 | Lee | H01L 29/7926 257/314 |
| 2018/0040734 | A1* | 2/2018 | Chang | H01L 21/28008 |
| 2018/0083128 | A1* | 3/2018 | Yokoyama | H01L 21/8249 |
| 2018/0240698 | A1* | 8/2018 | Lin | H01L 21/764 |

OTHER PUBLICATIONS

M. Rub et al., "A Novel Trench Concept for the Fabrication of Compensation Devices", Proc. ISPSD, pp. 203-206, Apr. 2003.

* cited by examiner

SEMICONDUCTOR DEVICE HAVING A TRIPLE INSULATING FILM SURROUNDED VOID

CROSS-REFERENCE TO RELATED APPLICATIONS

This application is based upon and claims the benefit of priority from Japanese Patent Application No. 2017-102560, filed on May 24, 2017; the entire contents of which are incorporated herein by reference.

FIELD

Embodiments of the invention relate generally to a semiconductor device and a method of manufacturing the same.

BACKGROUND

As a semiconductor device used for a purpose such as power control, there can be cited MOSFET (Metal Oxide Semiconductor Field Effect Transistor). Some of such MOSFET have a super junction structure in which n-type semiconductor regions and p-type semiconductor regions are alternately provided via respective trenches. The MOSFET having such a structure is provided with the trenches high in aspect ratio due to the miniaturization of the pitch of the cells, and has a problem of improving easiness of filling the trenches in addition to protection of the semiconductor regions.

DETAILED DESCRIPTION

Figure 1:
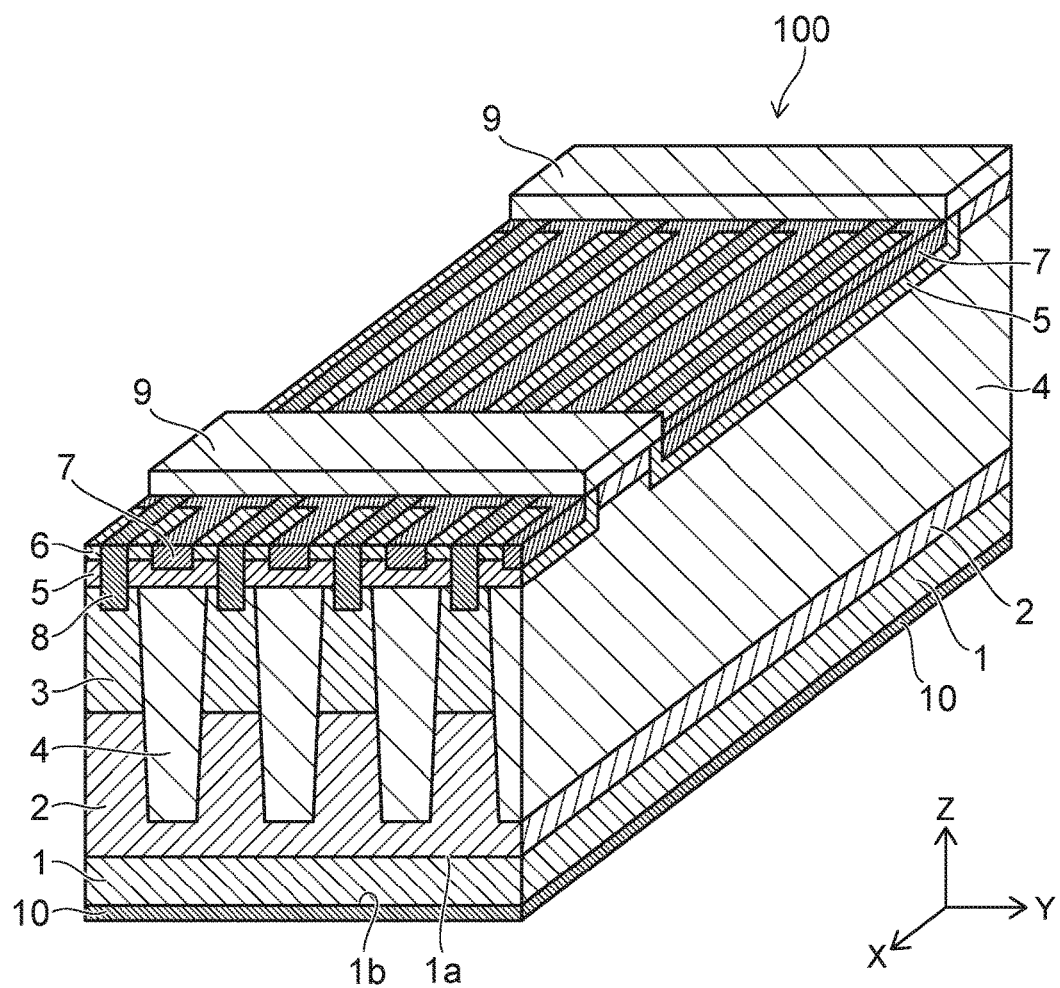
FIG. 1 is a perspective view showing a semiconductor device according to a first embodiment.

According to an embodiment, a method of manufacturing a semiconductor device includes forming a semiconductor layer having a first conductivity type on a semiconductor substrate, forming a trench in the semiconductor substrate and the semiconductor layer, forming a semiconductor film having a second conductivity type on an inner wall surface and a bottom surface of the trench, forming a first insulating film including silicon oxide on a side surface and a bottom surface of the semiconductor film, forming a second insulating film including silicon nitride on a side surface and a bottom surface of the first insulating film, and forming a third insulating film including silicon oxide on a side surface and a bottom surface of the second insulating film.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, the same components as those described in the previous drawing are marked with like reference numerals, and a detailed description is omitted as appropriate.

Hereinafter, in the specification, there is adopted an XYZ orthogonal coordinate system. The direction from a drain region 1 toward a semiconductor region 2 is defined as a Z direction, and two directions perpendicular to the Z direction and perpendicular to each other are defined as X direction and Y direction.

It should be noted that regarding the embodiments described hereinafter, the embodiments can be implemented with the semiconductor regions reversed between the p-type and the n-type.

First Embodiment

FIG. 1 is a perspective view showing a semiconductor device according to the embodiment.

Figure 2:
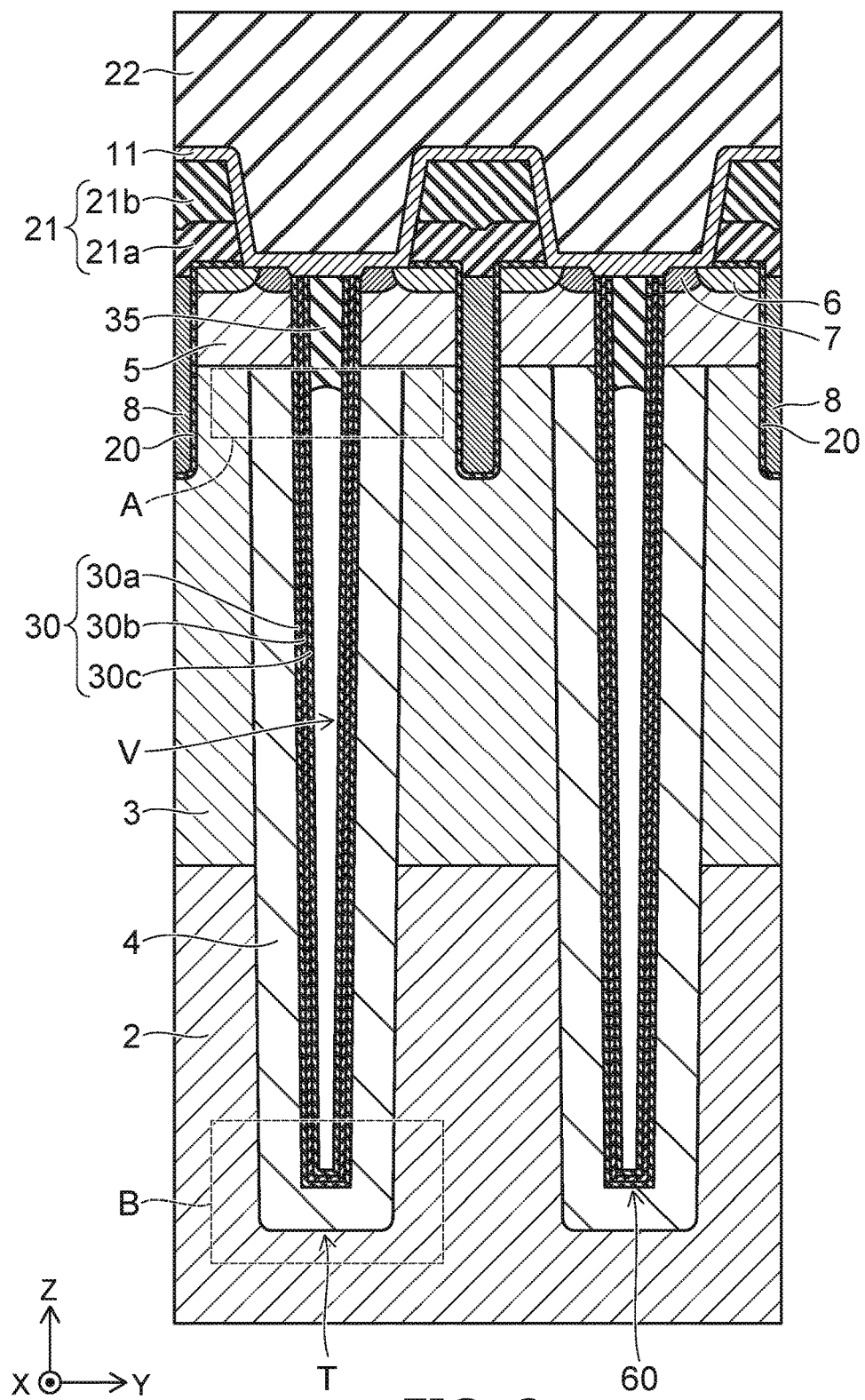
FIG. 2 is a cross-sectional view showing the semiconductor device according to the first embodiment.

FIG. 2 is a cross-sectional view showing the semiconductor device according to the embodiment.

Figure 3A:
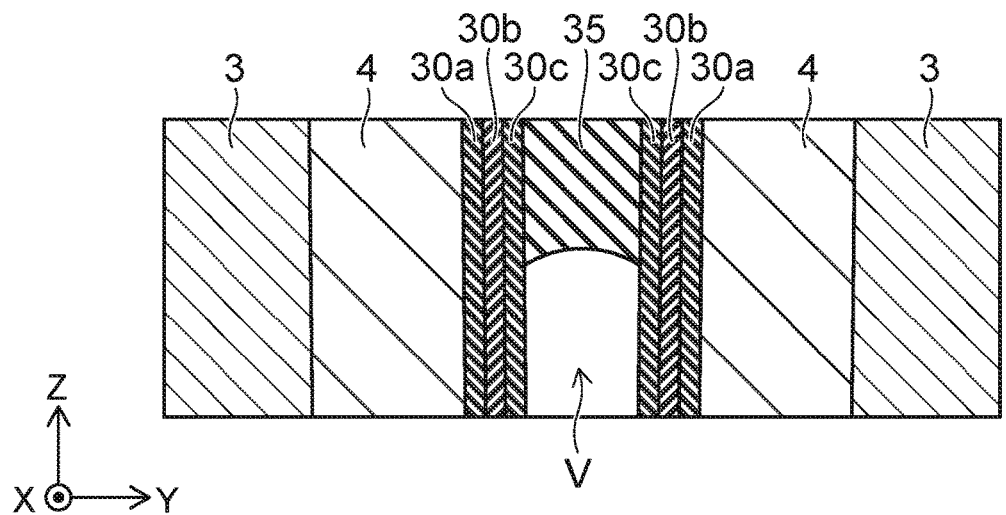
FIG. 3A and FIG. 3B are enlarged views of an area A and an area B of FIG. 2, respectively.
Figure 3B:
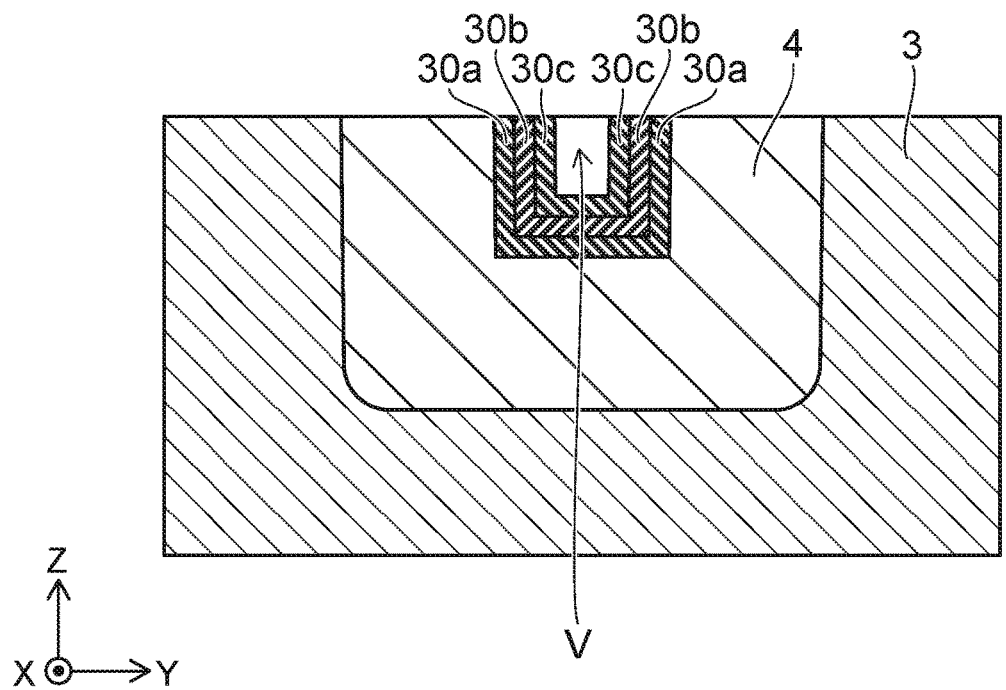

FIG. 3A and FIG. 3B are enlarged views of the area A and the area B of FIG. 2, respectively.

FIG. 1 and FIG. 2 show the perspective view and the cross-sectional view of the semiconductor device 100, respectively. FIG. 2 shows a part of the semiconductor device 100 shown in FIG. 1 in an enlarged manner. It should be noted that in FIG. 1, illustration of source electrode 11 and columnar sections 60 is omitted.

The semiconductor device 100 is, for example, a MOSFET.

As shown in FIG. 1, the semiconductor device 100 is provided with the drain region 1, the semiconductor region 2 having a first conductivity type, semiconductor regions 3 each having the first conductivity type, semiconductor regions 4 each having a second conductivity type, semiconductor regions 5 each having the second conductivity type, semiconductor regions 6 each having the first conductivity type, contact regions 7, gate electrodes 8, gate contacts 9, and a drain electrode 10.

The conductivity type of the drain region 1 is, for example, an $n^+$ type.

The notations of $n^+$, n, $n^-$, and $p^+$, p, $p^-$ represent relative levels of the effective impurity concentrations in each of the conductivity types. Specifically, the notations attached with "+" represent the fact that the impurity concentration is relatively higher than that of the notation to which neither "+" nor "−" is attached, and the notations attached with "−" represent the fact that the impurity concentration is relatively lower than that of the notation to which neither "+" nor "−" is attached.

Further, the "effective impurity concentration" denotes the concentration of the impurity having a contribution to the conductivity of the semiconductor material, and in the case in which both of the impurity acting as the donor and the impurity acting as the acceptor are included, the "effective impurity concentration" denotes the concentration excluding the part where the impurity acting as the donor and the impurity acting as the acceptor are cancelled out. It should be noted that the n-type impurity is, for example, phosphorus (P), and the p-type impurity is, for example, boron (B).

The semiconductor region 2 is provided on the upper surface 1a of the drain region 1, and the conductivity type of the semiconductor region 2 is, for example, the n⁻ type.

The plurality of semiconductor regions 3 is provided on the semiconductor region 2, and the conductivity type of the semiconductor regions 3 is, for example, the n type. The semiconductor regions 3 are each, for example, an n-pillar region. The plurality of semiconductor regions 3 is selectively located on the semiconductor region 2. The semiconductor regions 3 extend in the X direction, and are disposed so as to be separated in the Y direction from each other.

The plurality of semiconductor regions 4 is provided on the semiconductor region 2, and the conductivity type of the semiconductor regions 4 is, for example, the p type. The semiconductor regions 4 are each, for example, a p-pillar region. The plurality of semiconductor regions 4 is selectively located on the semiconductor region 2. The semiconductor regions 4 extend in the X direction, and are disposed so as to be separated in the Y direction from each other so as to be located between the semiconductor regions 3 adjacent in the Y direction to each other.

The n-type semiconductor regions 3 and the p-type semiconductor regions 4 are alternately provided in the Y direction. In other words, the semiconductor device 100 of the embodiment is a MOSFET, and one having the super junction structure.

The plurality of semiconductor regions 5 is provided on the respective semiconductor regions 3 and the respective semiconductor regions 4, and the conductivity type of the semiconductor regions 5 is, for example, the p type. The semiconductor regions 5 are each, for example, a p-base region. The plurality of semiconductor regions 5 is selectively located on the respective semiconductor regions 3. The semiconductor regions 5 extend in the X direction, and are disposed so as to be separated in the Y direction from each other.

The plurality of semiconductor regions 6 is provided on the respective semiconductor regions 5, and the conductivity type of the semiconductor regions 6 is, for example, the n⁺ type. The semiconductor regions 6 are each, for example, a source region. The plurality of semiconductor regions 6 is selectively located on the respective semiconductor regions 5. The semiconductor regions 6 extend in the X direction, and are disposed so as to be separated in the Y direction from each other.

The plurality of contact regions 7 is provided on the respective semiconductor regions 5, and the conductivity type of the contact regions 7 is, for example, the p⁺ type. The plurality of contact regions 7 is selectively located on the respective semiconductor regions 5. The contact regions 7 extend in the X direction, and are disposed so as to be separated in the Y direction from each other so as to be located between the semiconductor regions 6 adjacent in the Y direction to each other. The contact regions 7 are connected to a source electrode 11 described later.

The plurality of gate electrodes 8 is provided on the respective semiconductor regions 3 via respective gate insulating films 20 (see FIG. 2). The plurality of gate electrodes 8 is selectively located on the respective semiconductor regions 3.

The gate electrodes 8 extend in the X direction, and are disposed so as to be separated in the Y direction from each other so as to be located between the semiconductor regions 5 adjacent in the Y direction to each other. Further, the gate electrodes 8 are disposed so as to be separated in the Y direction from each other so as to be located between the semiconductor regions 6 adjacent in the Y direction to each other. In other words, the contact regions 7 and the gate electrodes 8 are alternately disposed in the Y direction via the respective semiconductor regions 6.

The gate electrodes 8 include, for example, polycrystalline silicon containing the n-type impurity.

The plurality of gate contacts 9 are provided on the gate electrodes 8. The gate contacts 9 extend in the Y direction, and are disposed in the X direction with predetermined intervals. The gate contacts 9 are formed of, for example, a metal material.

The gate electrodes 8 are electrically connected to an external peripheral circuit (not shown) via the gate contacts 9. By the voltage not less than a threshold value being supplied to the gate electrodes 8 via the gate contacts 9, the MOSFET is set to the ON state, and a channel (an inversion layer) is formed on the surface of each of the semiconductor regions 5.

The drain electrode 10 is provided on the lower surface 1b of the drain region 1. The drain electrode 10 is electrically connected to the drain region 1. The drain electrode 10 is formed of, for example, a metal material.

As shown in FIG. 2, the gate insulating film 20 is provided on a part of each of the semiconductor regions 6, and the side surfaces and the bottom surface of each of the gate electrodes 8. The gate insulating films 20 each include, for example, silicon oxide (SiO).

On the gate electrode 8 and the gate insulating film 20, there is provided an interlayer insulating film 21. For example, the interlayer insulating film 21 has a two-layer structure formed of a film 21a and a film 21b. The film 21a includes, for example, silicon oxide. The film 21b is provided on the film 21a, and includes, for example, BPSG (Boro-phospho silicate glass).

In each of the semiconductor regions 4, 5, there is provided an insulating section 30. The insulating sections 30 extend in the X direction. The insulating sections are provided in the respective trenches T formed in the semiconductor regions 2, 3. On the inner surface of each of the trenches T, there is located the insulating section 30 via the semiconductor region 4.

The trenches T each include a void part V. The insulating section 30 is located between the semiconductor region 4 and the void part V.

In the trench T and on the void part V, there is provided a cover film 35. The cover film 35 includes, for example, BPSG. The cover film 35 functions as, for example, a cap film in the trench T. The insulating section 30 is located between the cover film 35, and a part of the semiconductor region 4 and the semiconductor region 5.

The insulating section 30 and the cover film 35 constitute the columnar section 60 having the void part V formed inside.

It should be noted that in the example shown in FIG. 2, the cover film 35 is provided above the void part V, but can also be provided on at least a part of each of the side surfaces of the void part V. In other words, it is also possible for the cover film 35 to be located between the insulating section 30 and the void part V in the Y direction.

The insulating section 30 has an insulating film 30a, an insulating film 30b, and an insulating film 30c.

The insulating film 30a includes, for example, silicon oxide (SiO). The insulating film 30b includes a material having tensile stress such as silicon nitride (SiN). The insulating film 30c includes, for example, silicon oxide (SiO).

The shapes of the insulating film 30a, the insulating film 30b and the insulating film 30c are each, for example, a bottomed cylindrical shape. Further, the shape of the semiconductor region 4 is, for example, a bottomed cylindrical shape.

As shown in FIG. 3A, the insulating film 30a is located on the side surfaces of the semiconductor region 4. The insulating film 30b is located on the side surfaces of the insulating film 30a. The insulating film 30c is located on the side surfaces of the insulating film 30b. The insulating section 30 covers the side surfaces of the cover film 35 and the side surfaces of the void part V, and the insulating films 30c, 30b, 30a are located in a direction of getting away from these side surfaces in this order.

As shown in FIG. 3B, the insulating film 30a is located on the bottom surface of the semiconductor region 4. The insulating film 30b is located on the bottom surface of the insulating film 30a. The insulating film 30c is located on the bottom surface of the insulating film 30b. The insulating section 30 covers the bottom surface of the void part V, and the insulating films 30c, 30b, 30a are located in a direction of getting away from the bottom surface in this order.

In the film thickness in the insulating section 30, it is possible to make the insulating film 30a larger than the insulating film 30b and the insulating film 30c, and make the insulating film 30b larger than the insulating film 30c. Further, it is also possible to make the film thickness of the insulating film 30a thinner, and form the insulating film 30c from a CVD (Chemical Vapor Deposition) film. In this case, it is possible to make the insulating film 30c larger than the insulating film 30a and the insulating film 30b, and make the insulating film 30b larger than the insulating film 30a. It should be noted that instead of forming the insulating film 30c from the CVD film, it is also possible to form the insulating film 30c using another material high in coatability.

The total film thickness of the insulating film 30a and the insulating film 30c is not less than 0.5 times and not more than 4 times of the film thickness of the insulating film 30b. The total film thickness of the insulating film 30a and the insulating film 30c is more preferably not less than 1 times of (or comparable to or more than) and not more than 4 times of the film thickness of the insulating film 30b. In the case in which the insulating film 30a and the insulating film 30c include, for example, silicon oxide (SiO), and the insulating film 30b includes, for example, silicon nitride (SiN), the total film thickness of the insulating film 30a and the insulating film 30c is preferably about 1.8 times of the film thickness of the insulating film 30b.

The film thicknesses of the insulating films 30a, 30b and 30c correspond to the thicknesses in the Y direction of the insulating films 30a, 30b and 30c in the case in which the insulating films 30a, 30b and 30c are located on the side surface of the semiconductor region 4 in this order (the case of FIG. 3A), and correspond to the thicknesses in the Z direction of the insulating films 30a, 30b and 30c in the case in which the insulating films 30a, 30b and 30c are located on the bottom surface of the semiconductor region 4 in this order (the case of FIG. 3B).

The insulating film 30a protects, for example, the semiconductor region 3 and the semiconductor region 4. The insulating film 30b relaxes, for example, the stress (e.g., compressive stress) of the insulating film 30a. The insulating film 30c makes it easy to, for example, embed the cover film 35 in the trench T.

As shown in FIG. 2, the source electrode 11 is provided on a part of each of the semiconductor regions 6, the contact regions 7, and the side surfaces and the upper surface of each of the interlayer insulating films 21. Further, the source electrode 11 is provided on the insulating sections 30 and the cover films 35. The source electrode 11 is formed of, for example, a metal material.

On the source electrode 11, there is provided an interlayer insulating film 22. The interlayer insulating film 22 includes, for example, silicon oxide.

Then, a method of manufacturing the semiconductor device according to the embodiment will be described.

FIG. 4 through FIG. 9 are cross-sectional views showing the method of manufacturing the semiconductor device 100.

It should be noted that the regions shown in FIG. 4 through FIG. 9 correspond to some of the regions shown in FIG. 2. It should be noted that in FIG. 4 through FIG. 9, the part on or above the columnar sections 60, and the part on or below the semiconductor region 2 are not shown.

Figure 4:
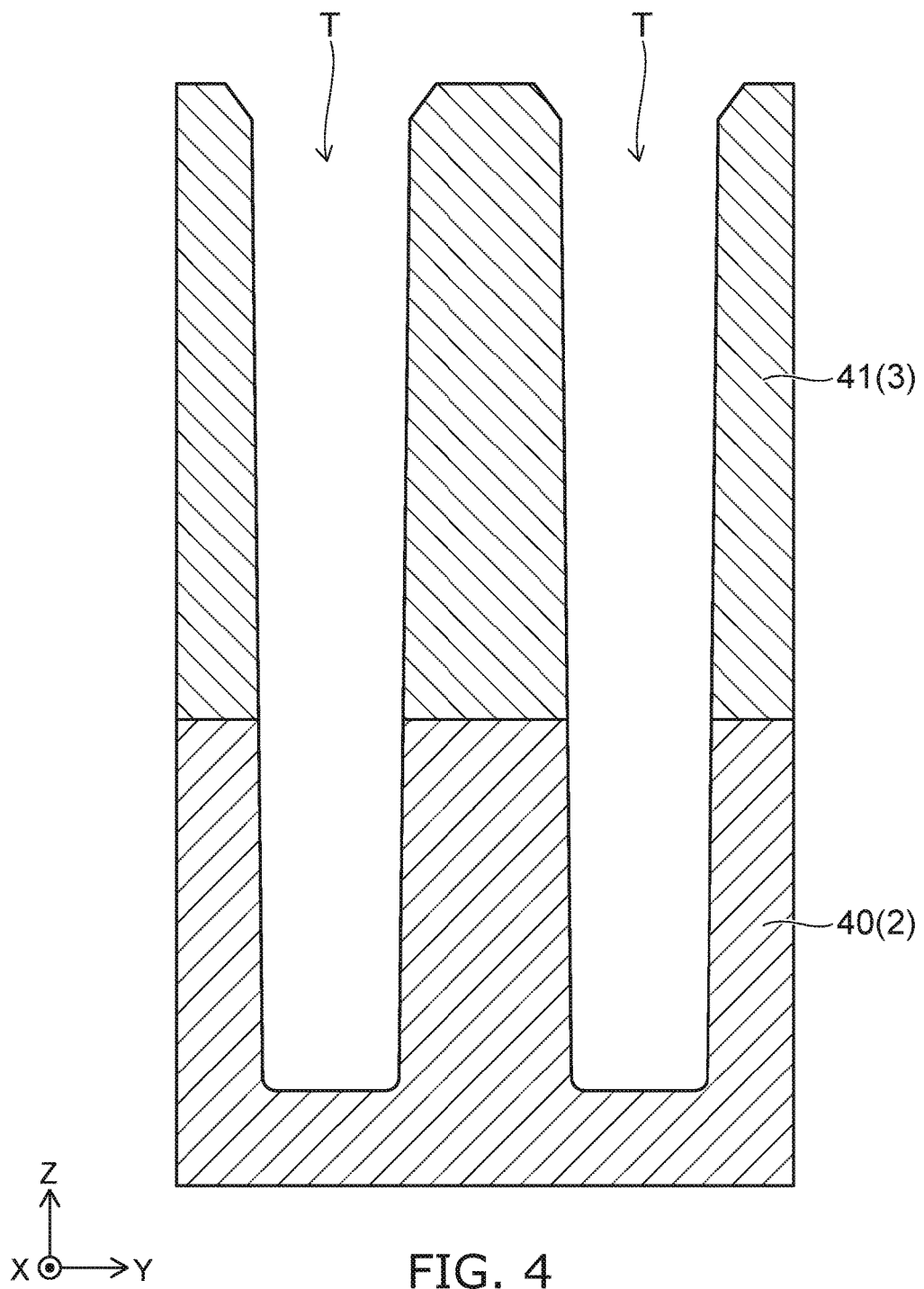
FIG. 4 through FIG. 9 are cross-sectional views showing a method of manufacturing the semiconductor device according to the first embodiment.

Firstly, as shown in FIG. 4, a semiconductor layer 41 having the first conductivity type is grown epitaxially on a semiconductor substrate 40 having the first conductivity type.

Subsequently, a mask member including a silicon oxide film or the like is formed on the semiconductor layer 41. For example, the mask member is formed by depositing a film on the semiconductor layer 41 using the CVD method, and then performing the lithography method and the RIE (Reactive Ion Etching) method thereon.

Subsequently, the trenches T are formed in the semiconductor substrate 40 and the semiconductor layer 41 using the mask member thus patterned as a mask. The trenches T are formed using, for example, the RIE method. Subsequently, the mask member is removed. It should be noted that the semiconductor substrate 40 provided with the trenches T corresponds to the semiconductor region 2. Further, the semiconductor layer 41 provided with the trenches T corresponds to the semiconductor regions 3.

Figure 5:
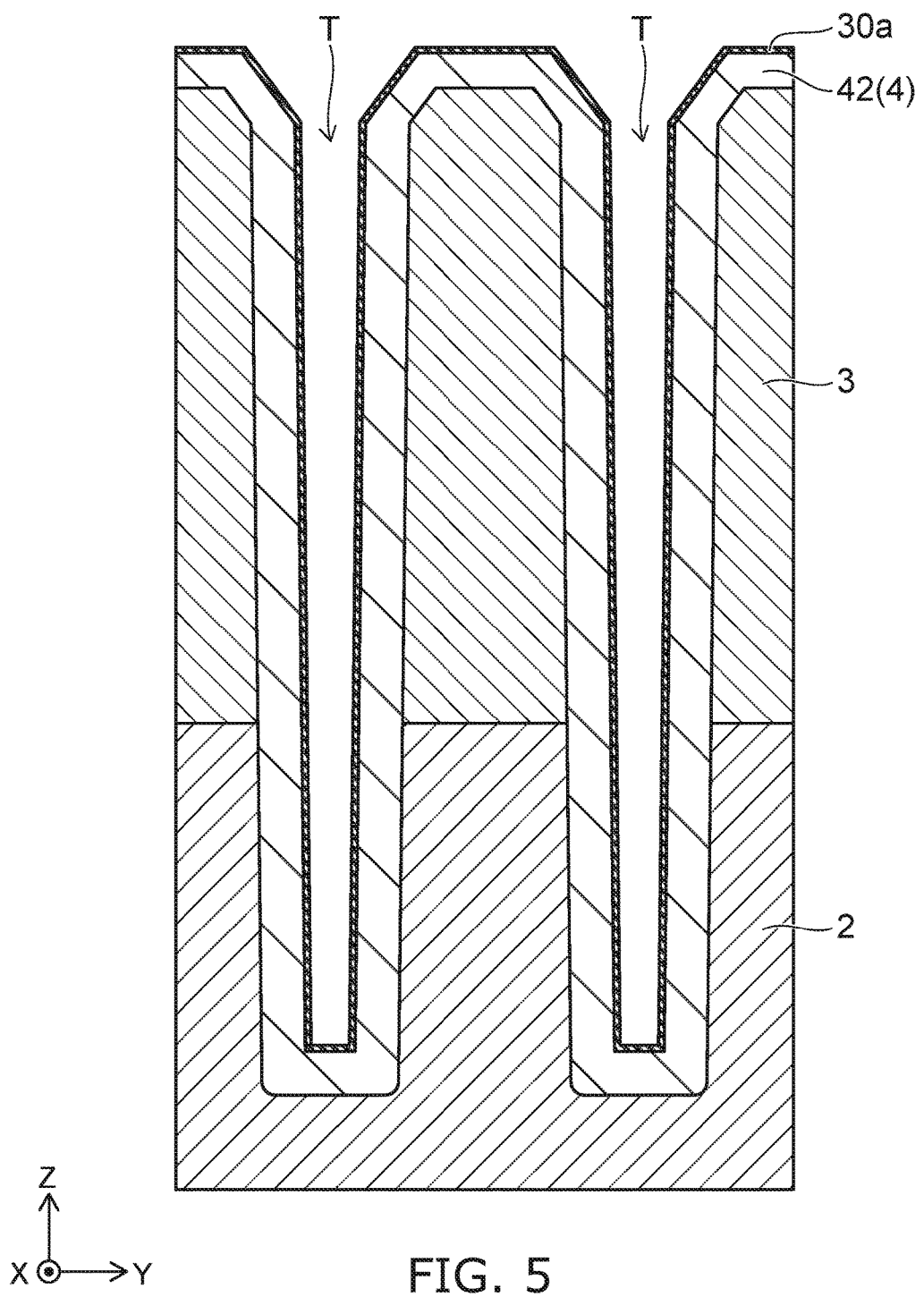

Then, as shown in FIG. 5, a semiconductor film 42 including the p-type impurity is formed on the inner wall surfaces and the bottom surface of each of the trenches T using the epitaxial growth method. The semiconductor film 42 is also formed on the semiconductor regions 3 each located between the trenches T. The semiconductor film 42 includes, for example, undoped single-crystalline silicon. The semiconductor film 42 corresponds to the semiconductor regions 4.

Subsequently, the insulating film 30a is formed in the trenches T and on the side surfaces and the bottom surface of each of the semiconductor regions 4 using, for example, thermal oxidation. The insulating film 30a is also formed on the semiconductor regions 4 each located between the trenches T. The insulating film 30a is formed of, for example, silicon oxide.

Figure 6:
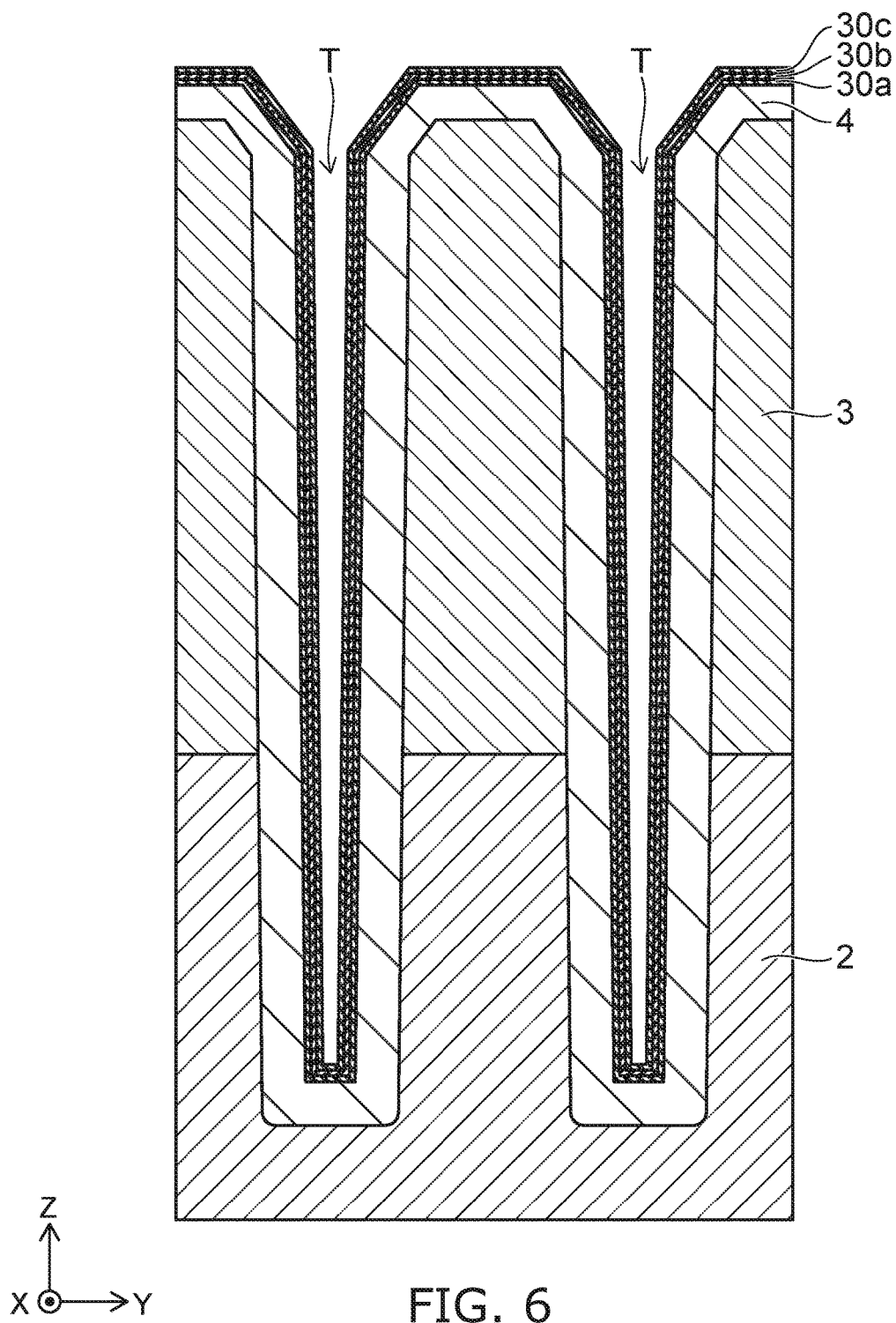

Then, as shown in FIG. 6, the insulating film 30b is formed in the trenches T and on the side surfaces and the bottom surface of each of the insulating films 30a using, for example, the LPCVD (Low Pressure Chemical Vapor Deposition) method. The insulating film 30b is also formed on the insulating film 30a located between the trenches T. The insulating film 30b is formed of, for example, silicon nitride.

Subsequently, the insulating film 30c is formed in the trenches T and on the side surfaces and the bottom surface of the insulating film 30b using, for example, thermal oxidation. The insulating film 30c is also formed on the insulating film 30b located between the trenches T. The insulating film 30c is formed of, for example, silicon oxide.

Figure 7:
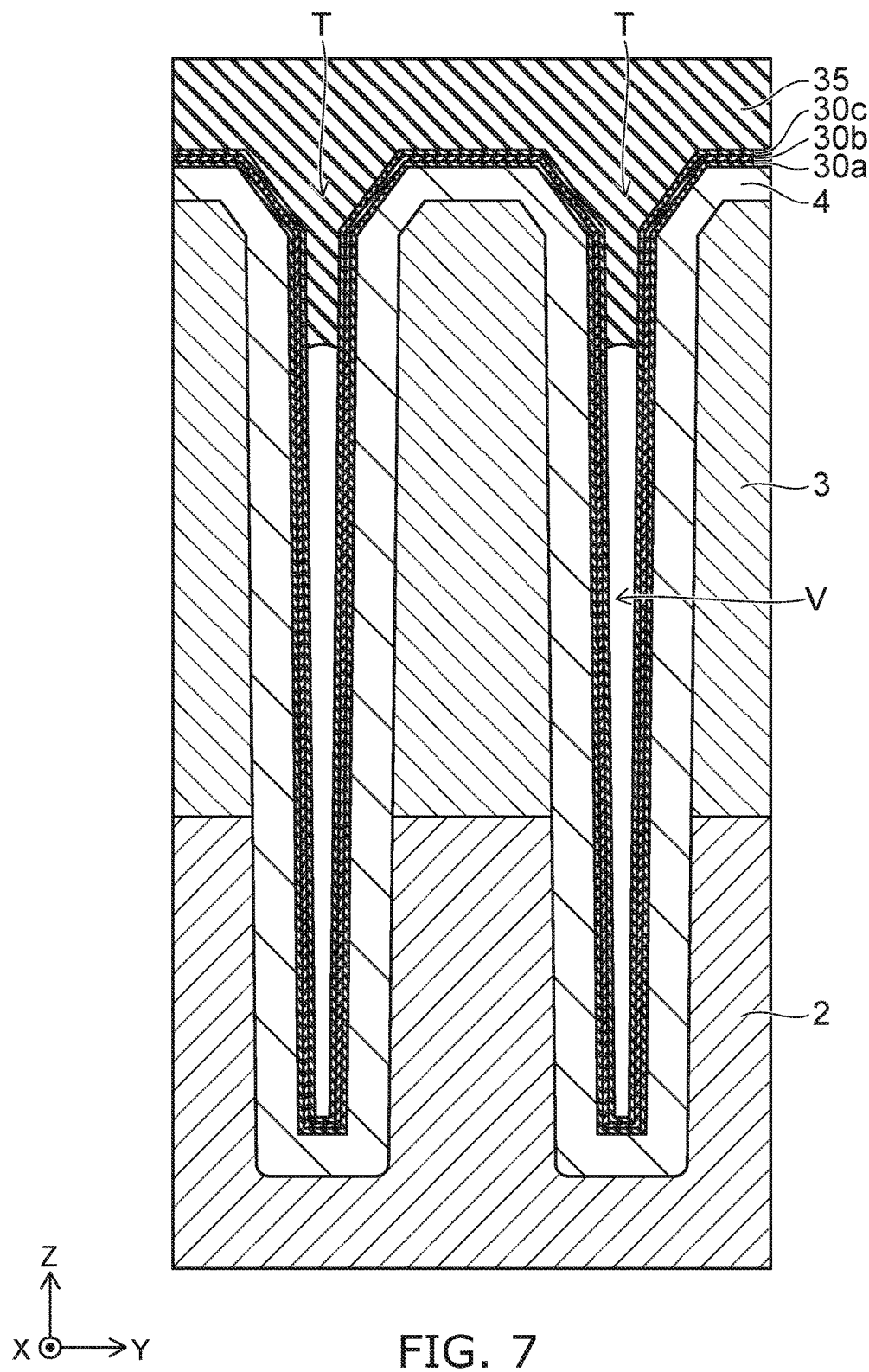

Then, as shown in FIG. 7, the cover film 35 is formed on the insulating film 30c using, for example, the CVD method so as to fill in the trenches T. The cover film 35 is formed of, for example, the BPSG. Thus, the void part V, on which the cover film 35 is located, is formed in each of the trenches T. Subsequently, a reflow process and an annealing treatment are performed on the cover film 35.

Since the insulating film 30c (the silicon oxide film) is formed on the side surfaces and the bottom surfaces of the insulating film 30b, the cover film 35 is apt to be formed in an upper part of each of the trenches T. In other words, due to the insulating film 30c, the easiness of embedding the cover film 35 in the depth direction (−Z direction) of the trench T is improved.

Figure 8:
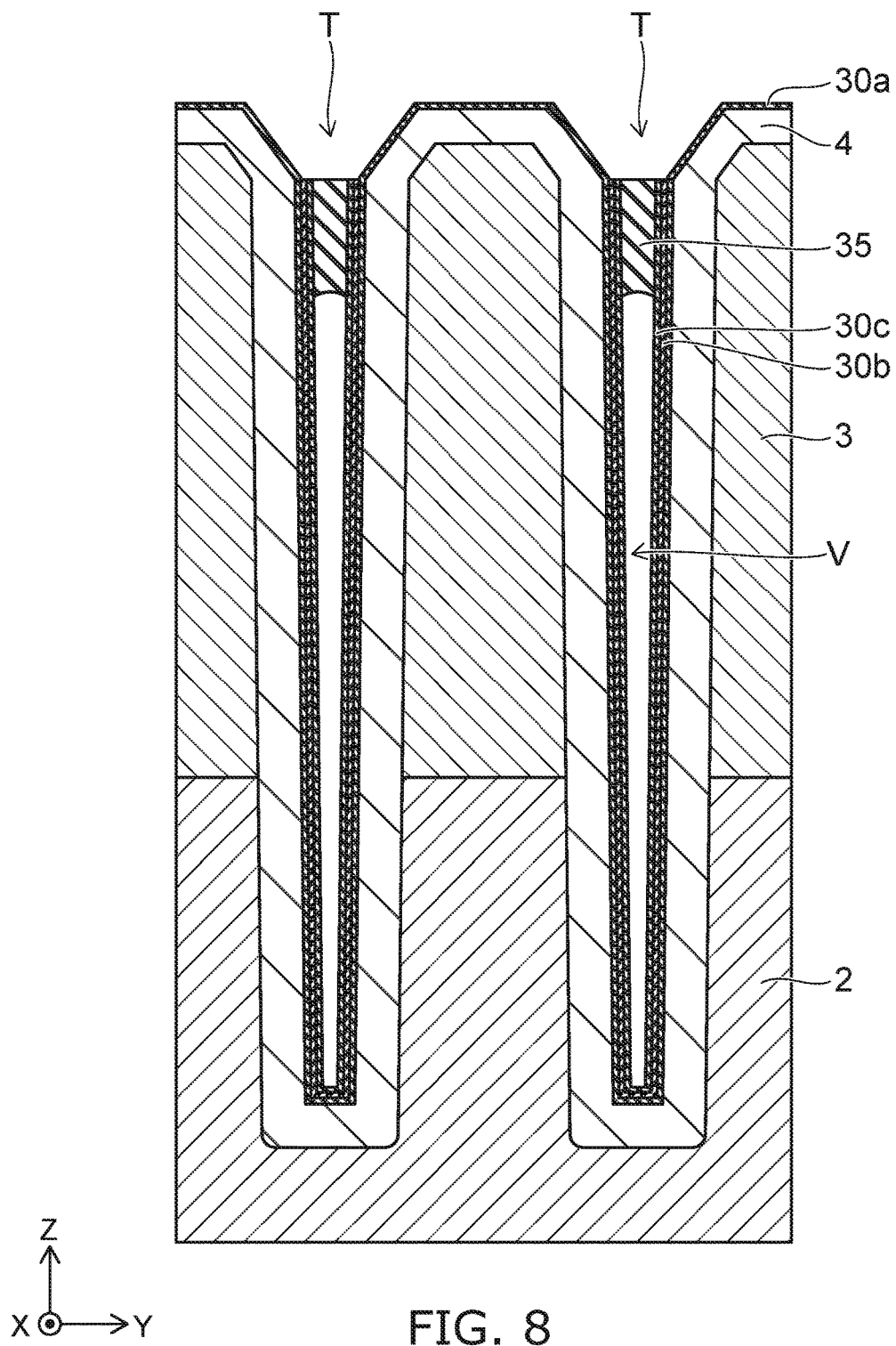

Then, as shown in FIG. 8, the cover film 35 is partially removed by performing an etching process. The etch back is performed so as to remove the cover film 35 located on the trenches T and between the trenches T. Subsequently, the insulating films 30b, 30c located on the insulating film 30a and between the trenches T using, for example, the CDE (Chemical Dry Etching) method.

Figure 9:
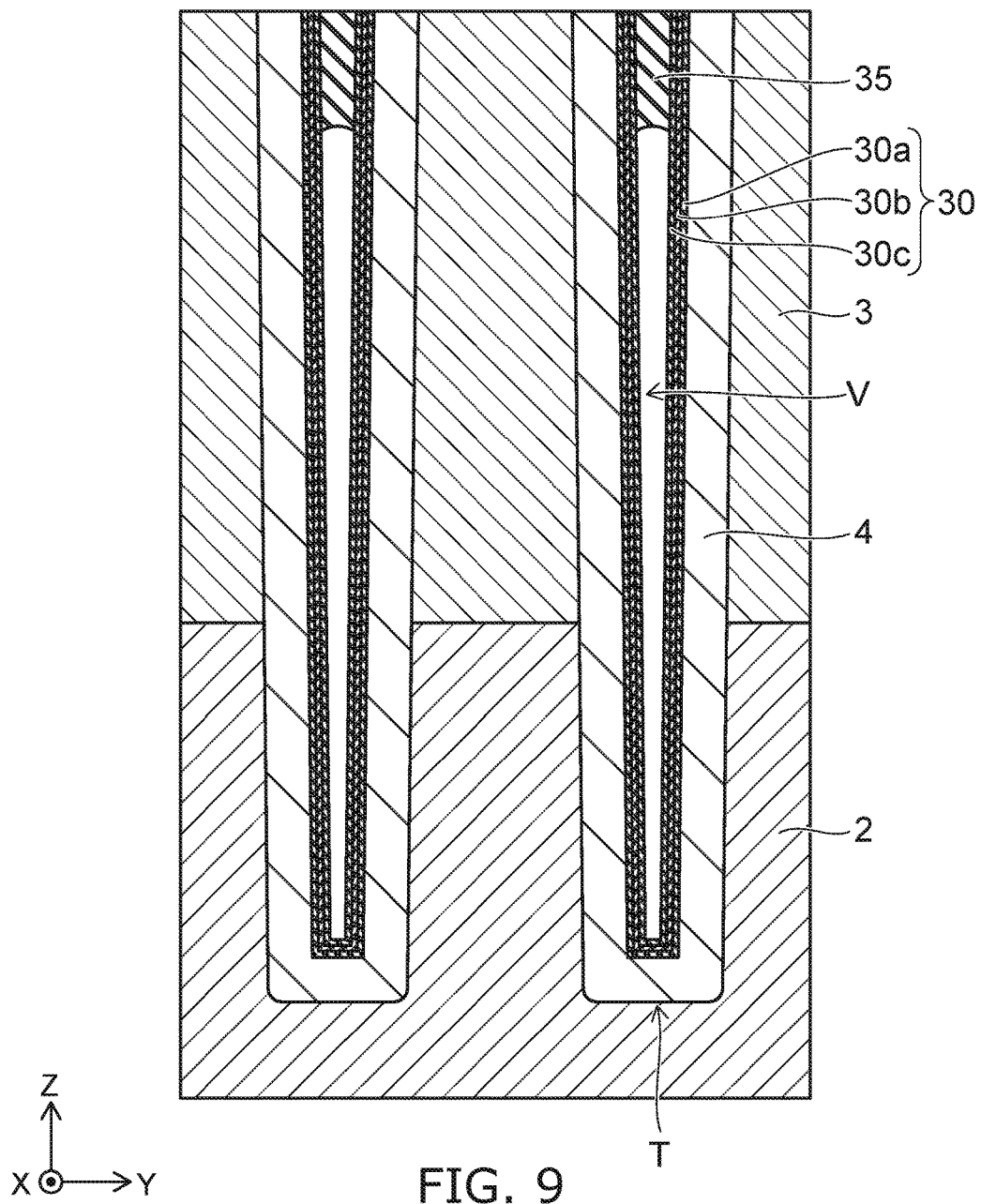

Then, as shown in FIG. 9, the insulating film 30a located on the semiconductor regions 4 and between the trenches T is removed by performing an etching process. Subsequently, the semiconductor regions 3 and the semiconductor regions 4 are partially removed using, for example, the CMP (Chemical Mechanical Polishing) method. Thus, the upper surfaces of the insulating films 30a, 30b and 30c, and the upper surface of the cover films 35 are planarized, and thus, the insulating sections 30 each having the insulating film 30a, the insulating film 30b and the insulating film 30c are formed.

Subsequently, using a known manufacturing method, the semiconductor regions 5, 6, the contact regions 7, the gate insulating films 20 and the gate electrodes 8 are formed. Subsequently, by forming the interlayer insulating film 21, the source electrode 11, the interlayer insulating film 22, the gate contacts 9, and the drain electrode 10, the semiconductor device 100 is formed.

Then, the advantages of the embodiment will be described.

In the MOSFET having the super junction structure in which the n-type semiconductor regions and the p-type semiconductor regions are alternately provided via the trenches, the trenches high in aspect ratio are apt to be formed due to the miniaturization of the pitch of the cells. On the inner surfaces and the upper part of each of the trenches, there are formed the p-type semiconductor region and the cover film, respectively, and the void part is formed in a part (a part surrounded by the p-type semiconductor region and the cover film) of each of the trenches in some cases.

In such a MOSFET, the current becomes apt to leak from the p-type semiconductor region to the void part. There is a possibility that a trouble occurs in the operation of the MOSFET due to the leakage current to the void part. Further, in the case of forming the cover film on the upper part of each of the trenches, the easiness of embedding the cover film in the trench becomes apt to degrade depending on the material of the film the side surface of which the cover film is located on.

Further, in some cases, the impurities such as boron or phosphorus included in the cover film infiltrate in the n-type semiconductor region or the p-type semiconductor region, and it is conceivable to form a thick film on the sidewall of the p-type semiconductor region in order to protect these semiconductor regions. However, if a film (e.g., a silicon oxide film) having compressive stress is formed on the sidewall of the p-type semiconductor region, the warpage of the wafer increases since the film having the compressive stress is thickly formed. The large warpage of the wafer degrades the processing accuracy in the manufacturing process, and provides cause of hindering the stable operation of the manufacturing device.

In the semiconductor device 100 of the embodiment, the insulating films 30a, 30b and 30c are provided in sequence on the semiconductor region 4 in the trench T. If such insulating films 30a, 30b and 30c (e.g., an ONO film) are provided, the current is prevented from leaking from the semiconductor region 4 to the void part V.

Further, in the embodiment, the semiconductor regions 3 and the semiconductor regions 4 are protected by the insulating film 30a from the impurities and so on of the cover film 35. Further, since the insulating film 30b includes the material (e.g., silicon nitride) having the tensile stress, the stress of the insulating film 30a canceled out by the insulating film 30b to thereby suppress the warpage of the wafer. For example, if the film thickness of the insulating film 30a and the film thickness of the insulating film 30b are set so as to have a predetermined ratio (e.g., the total film thickness of the insulating film 30a and the insulating film 30b is set to about 1.8 times of the film thickness of the insulating film 30b), the infiltration of the impurities of the cover film 35 and the warpage of the wafer are further suppressed.

Further, in the embodiment, since the insulating film 30c includes, for example, the silicon oxide, it becomes easy for the cover film 35 to be formed on the side surfaces of the insulating film 30c. In other words, the easiness of embedding the cover film 35 to the trench T is improved.

According to the embodiment, it is possible to provide a semiconductor device improved in reliability and a method of manufacturing the semiconductor device.

Second Embodiment

Figure 10:
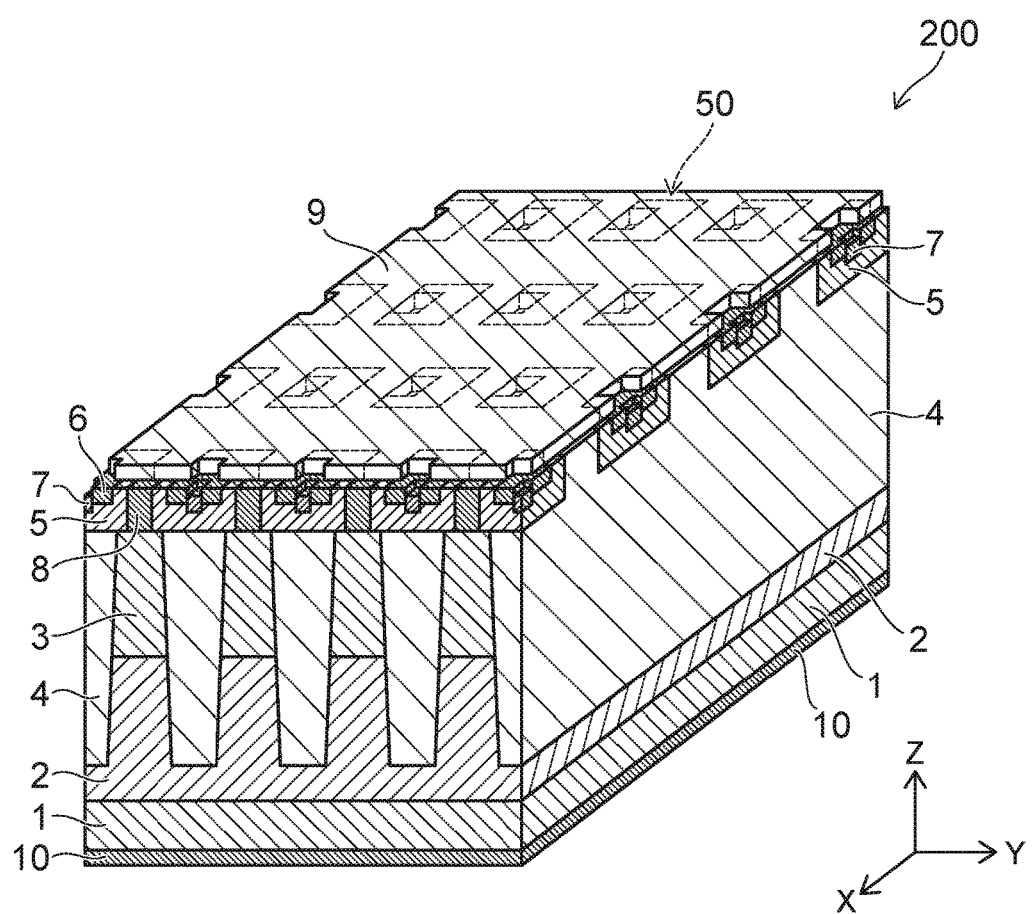
FIG. 10 is a perspective view showing a semiconductor device according to a second embodiment.

FIG. 10 is a perspective view showing a semiconductor device according to the embodiment.

FIG. 10 is a perspective view showing the semiconductor device 200. The regions shown in FIG. 10 correspond to the regions shown in FIG. 1. It should be noted that in FIG. 10, illustration of the source electrode 11 and the columnar sections 60 is omitted.

In the embodiment, the configuration on or above the semiconductor regions 3 and the semiconductor regions 4 is different from that of the first embodiment. Therefore, the detailed description of the configuration other than this configuration will be omitted.

As shown in FIG. 10, the semiconductor device 200 is provided with the drain region 1, the semiconductor region 2, the semiconductor regions 3, the semiconductor regions 4, the semiconductor regions 5, the semiconductor regions 6, the contact regions 7, the gate electrodes 8, the gate contact 9, and the drain electrode 10.

The plurality of semiconductor regions 5 is provided on the respective semiconductor regions 3 and the respective semiconductor regions 4. The plurality of semiconductor regions 5 is disposed in an X-Y plane so as to form islands.

The plurality of semiconductor regions 6 is provided on the respective semiconductor regions 5. The plurality of semiconductor regions 6 is disposed in an X-Y plane so as to form islands.

The plurality of contact regions 7 is provided on the respective semiconductor regions 5. The plurality of contact regions 7 is disposed in an X-Y plane so as to form islands. Further, the contact regions 7 are disposed so as to be separated in the Y direction from each other so as to be located between the semiconductor regions 6 adjacent in the Y direction to each other.

A plurality of regions 50 respectively including the semiconductor regions 5, the semiconductor regions 6, and the contact regions 7 is disposed in an X-Y plane so as to form islands.

The gate electrodes 8 are provided on the respective semiconductor regions 3 in a reticular pattern. The gate electrodes 8 are located between the semiconductor regions 5 adjacent in the X direction and the Y direction to each other.

The gate contact 9 is provided on the gate electrodes 8.

In the embodiment, the configuration and the arrangement of the insulating sections 30 are the same as those of the first embodiment. Specifically, as shown in FIG. 2, FIG. 3A and FIG. 3B, the insulating sections 30 each include the insulating films 30a, 30b and 30c, and are provided in the respective semiconductor regions 4, 5.

The advantages of the embodiment are the same as those of the first embodiment described above.

Third Embodiment

Figure 11:
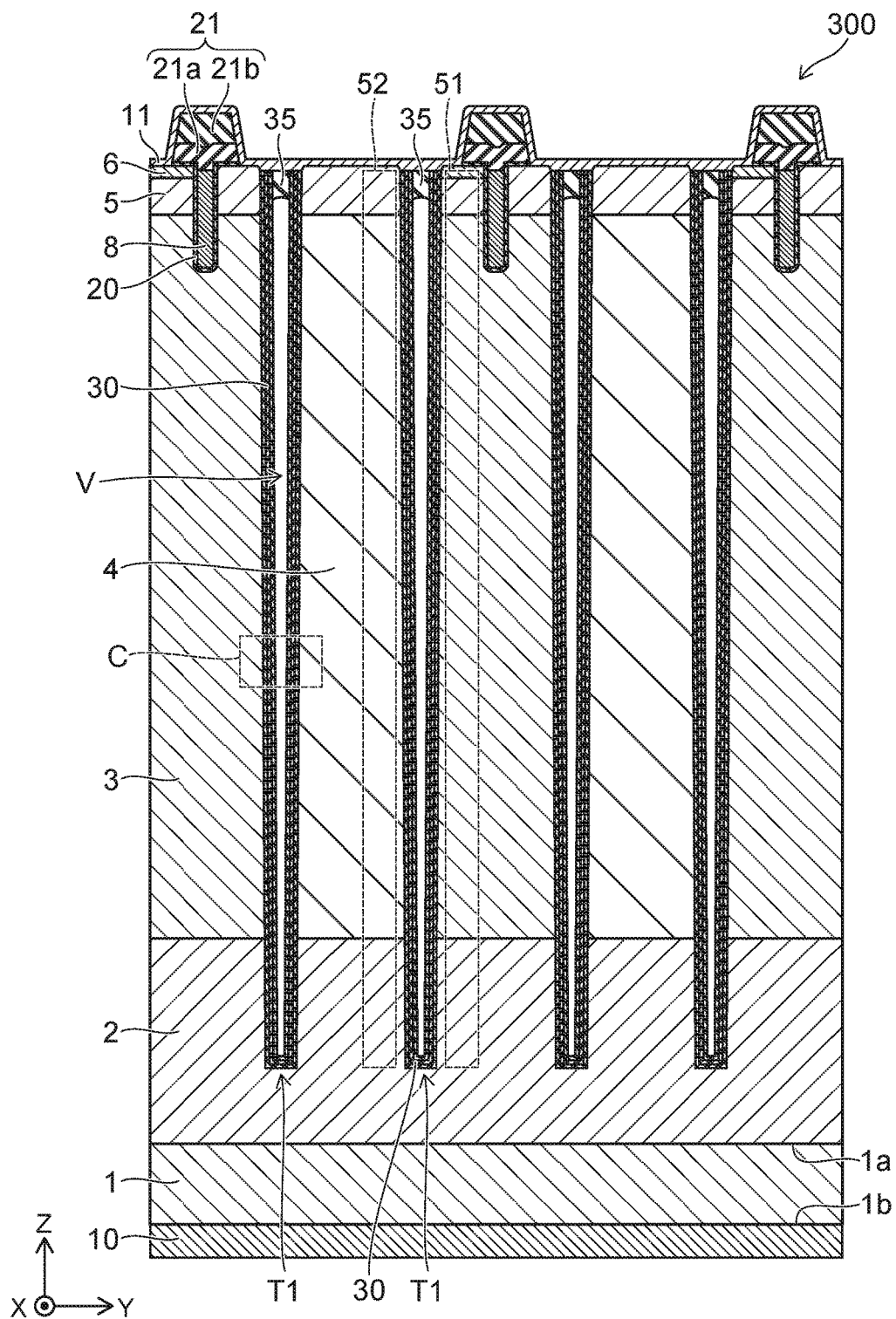
FIG. 11 is a cross-sectional view showing a semiconductor device according to a third embodiment.

FIG. 11 is a cross-sectional view showing a semiconductor device according to the embodiment.

Figure 12:
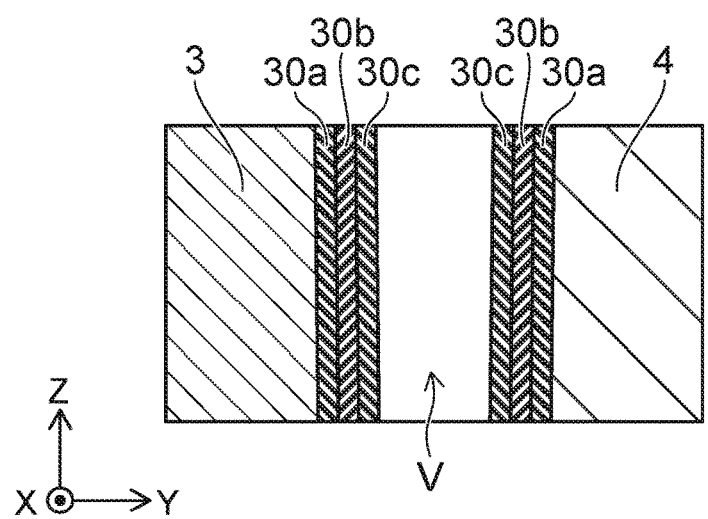
FIG. 12 is an enlarged view of an area C of FIG. 11.

FIG. 12 is an enlarged view of the area C of FIG. 11.

As shown in FIG. 11, the semiconductor device 300 is provided with the drain region 1, the semiconductor region 2, the semiconductor regions 3, the semiconductor regions 4, the semiconductor regions 5, the semiconductor regions 6, the gate electrodes 8, the drain electrode 10, the source electrode 11, the gate insulating films 20, the interlayer insulating films 21, the insulating sections 30, and the cover films 35. The interlayer insulating films 21 each have the film 21a and the film 21b.

The semiconductor region 2 is provided on the upper surface 1a of the drain region 1.

The plurality of semiconductor regions 3 is provided on the semiconductor region 2. The semiconductor regions 3 extend in the X direction, and are disposed so as to be separated in the Y direction from each other.

The plurality of semiconductor regions 4 is provided on the semiconductor region 2. The semiconductor regions 4 extend in the X direction, and are disposed so as to be separated in the Y direction from each other so as to be located between the semiconductor regions 3 adjacent in the Y direction to each other.

The plurality of semiconductor regions 3 and the plurality of semiconductor regions 4 are formed using a multistage epitaxial method. For example, ion injection using a lithography method and the epitaxial growth method are alternately repeated in the Z direction. Thus the n-type semiconductor regions 3 and the p-type semiconductor regions 4 are provided on the semiconductor region 2 so as to be alternately located in the Y direction. In other words, the semiconductor device 300 of the embodiment is a MOSFET, and one having the super junction structure.

The plurality of semiconductor regions 5 is provided on the respective semiconductor regions 3 and the respective semiconductor regions 4. The semiconductor regions 5 are disposed so as to be separated in the Y direction from each other.

The plurality of semiconductor regions 6 is provided on the respective semiconductor regions 5. The semiconductor regions 6 are disposed so as to be separated in the Y direction from each other.

The plurality of gate electrodes 8 is provided on the respective semiconductor regions 3 via the respective gate insulating films 20. The gate electrodes 8 are disposed so as to be separated in the Y direction from each other.

The drain electrode 10 is provided on the lower surface 1b of the drain region 1.

The source electrode 11 is provided on a part of each of the semiconductor regions 5, a part of each of the semiconductor regions 6, the interlayer insulating films 21, the insulating sections 30, and the cover films 35.

The insulating sections 30 are provided in respective trenches T1. As indicated by the dotted lines, the trenches T1 are each formed between a semiconductor region 51 formed of the semiconductor region 2, the semiconductor region 3, the semiconductor region 5 and the semiconductor region 6, and a semiconductor region 52 formed of the semiconductor region 2, the semiconductor region 4 and the semiconductor region 5. The insulating sections 30 are located on the inner surfaces of the respective trenches T1.

The cover films 35 are provided on the void parts V of the respective trenches T1. The insulating section 30 is located between the semiconductor region 51, and the void part V and the cover film 35. Further, the insulating section 30 is located between the semiconductor region 52, and the void part V and the cover film 35.

As shown in FIG. 12, the insulating section 30 has the insulating film 30a, the insulating film 30b and insulating film 30c.

The insulating films 30a are located on the side surfaces of each of the semiconductor regions 51, and the side surfaces of each of the semiconductor regions 52. Further, the insulating film 30a is located on the bottom surface of each of the trenches T1 and on the semiconductor region 2.

The insulating film 30b is located on the side surfaces and the bottom surface of the insulating film 30a.

The insulating film 30c is located on the side surfaces and the bottom surface of the insulating film 30b.

In other words, the insulating section 30 covers the side surfaces of the cover film 35 and the side surfaces and the bottom surface of the void part V, and the insulating films 30c, 30b, 30a are located in a direction of getting away from these side surfaces and the bottom surface in this order. The shapes of the insulating film 30a, the insulating film 30b and the insulating film 30c are each, for example, a bottomed cylindrical shape.

The advantages of the embodiment are the same as those of the first embodiment described above.

As described above, although the description is presented using the MOSFET having the super junction structure as an example, the semiconductor device according to each of the embodiments can also be applied to other semiconductor devices such as an IGBT (Insulated Gate Bipolar Transistor) having the super junction structure.

In each of the embodiments, as the semiconductor region 2 and the semiconductor region 3, two regions having the first conductivity type are formed, but it is not limited to two regions. a portion including the semiconductor region 2 and the semiconductor region 3 can be configured by one semiconductor region. The portion including the semiconductor region 2 and the semiconductor region 3 can be configured by three or more semiconductor regions. In this case, the conductivity type of each semiconductor region is the same conductivity type.

In the portion including the semiconductor region 2 and the semiconductor region 3, a distribution of the impurity concentration can be formed. For example, the distribution of the impurity concentration can be formed so that the impurity concentration is relatively high in the upper side of the portion including the semiconductor region 2 and the semiconductor region 3, and the impurity concentration is relatively low in the lower side of the portion including the semiconductor region 2 and the semiconductor region 3. Further, there is a case that a boundary of concentration based on the impurity concentration is not generated in the portion including the semiconductor region 2 and the semiconductor region 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first semiconductor region extending in a first direction and having a first conductivity type;
a second semiconductor region extending in the first direction, disposed with the first semiconductor region in a second direction crossing the first direction, surrounding a void, and having a second conductivity type;
an insulating section provided between the void and the second semiconductor region, and including a first insulating film including silicon oxide, a second insulating film including silicon nitride, and a third insulating film including silicon oxide;
a third semiconductor region provided on the first semiconductor region and the second semiconductor region, and having the second conductivity type; and
a cover film provided on the void, the insulating section being located between the third semiconductor region and the cover film.

2. The device according to claim 1, wherein
the first insulating film, the second insulating film and the third insulating film are located in sequence from the second semiconductor region toward the void.

3. The device according to claim 1, wherein
the first insulating film is located on a side surface and a bottom surface of the second semiconductor region,
the second insulating film is located on a side surface and a bottom surface of the first insulating film, and
the third insulating film is located on a side surface and a bottom surface of the second insulating film.

4. The device according to claim 1, wherein
a total thickness of the first insulating film and the third insulating film is not less than 0.5 times and not more than 4 times of a thickness of the second insulating film.

5. The device according to claim 1, wherein
the first semiconductor region includes a first region, and a second region provided on the first region and higher in impurity concentration than the first region.

6. The device according to claim 1, further comprising:
a fourth semiconductor region having the first conductivity type, the first semiconductor region being located on an upper surface of the fourth semiconductor region,
wherein the first direction is a direction from the fourth semiconductor region toward the first semiconductor region.

7. A semiconductor device comprising:
a first semiconductor region extending in a first direction and having a first conductivity type;
a second semiconductor region extending in the first direction, disposed with the first semiconductor region in a second direction crossing the first direction, surrounding a void, and having a second conductivity type;
an insulating section provided between the void and the second semiconductor region, and including a first insulating film including silicon oxide, a second insulating film including silicon nitride, and a third insulating film including silicon oxide; and
a plurality of third semiconductor regions provided on the first semiconductor region and the second semiconductor region, and having the second conductivity type,
wherein the plurality of third semiconductor regions is disposed as islands when viewed from the first direction.

8. The device according to claim 7, wherein
the first insulating film, the second insulating film and the third insulating film are located in sequence from the second semiconductor region toward the void.

9. The device according to claim 7, wherein
the first insulating film is located on a side surface and a bottom surface of the second semiconductor region,
the second insulating film is located on a side surface and a bottom surface of the first insulating film, and
the third insulating film is located on a side surface and a bottom surface of the second insulating film.

10. The device according to claim 7, wherein
a total thickness of the first insulating film and the third insulating film is not less than 0.5 times and not more than 4 times of a thickness of the second insulating film.

11. The device according to claim 7, wherein
the first semiconductor region includes a first region, and a second region provided on the first region and higher in impurity concentration than the first region.

12. The device according to claim 7, further comprising:
a fourth semiconductor region having the first conductivity type, the first semiconductor region being located on an upper surface of the fourth semiconductor region,
wherein the first direction is a direction from the fourth semiconductor region toward the first semiconductor region.

13. A semiconductor device comprising:
a first semiconductor region extending in a first direction and having a first conductivity type;
a second semiconductor region extending in the first direction, disposed with the first semiconductor region in a second direction crossing the first direction via a void, and having a second conductivity type;
an insulating section provided between the void, and the first semiconductor region and the second semiconductor region, the insulating section including a first insulating film including silicon oxide, a second insulating film including silicon nitride, and a third insulating film including silicon oxide;
a third semiconductor region provided on the first semiconductor region and the second semiconductor region, and having the second conductivity type; and
a cover film provided on the void, the insulating section being located between the third semiconductor region and the cover film.

14. The device according to claim 13, wherein
the first insulating film, the second insulating film and the third insulating film are located in sequence from the first semiconductor region toward the void, and from the second semiconductor region toward the void.

15. The device according to claim 13, wherein
the first insulating film is located on a side surface of the first semiconductor region, and a side surface of the second semiconductor region,
the second insulating film is located on a side surface of the first insulating film, and
the third insulating film is located on a side surface of the second insulating film.

16. The device according to claim 13, wherein
a total thickness of the first insulating film and the third insulating film is not less than 0.5 times and not more than 4 times of a thickness of the second insulating film.

17. The device according to claim 13, further comprising:
a fourth semiconductor region having the first conductivity type, the first semiconductor region and the second semiconductor region being located on an upper surface of the fourth semiconductor region,
wherein the insulating section is located on a side surface and a bottom surface of the fourth semiconductor region.

18. The device according to claim 17, further comprising:
a fifth semiconductor region having the first conductivity type, the fourth semiconductor region is located on an upper surface of the fifth semiconductor region,
wherein the first direction is a direction from the fifth semiconductor region toward the fourth semiconductor region.

* * * * *